United States Patent
Nishimura

[11] Patent Number: 5,935,257
[45] Date of Patent: Aug. 10, 1999

[54] SKEW-REDUCTION CIRCUIT AND SEMICONDUCTOR DEVICE

[75] Inventor: Koichi Nishimura, Kawasaki, Japan

[73] Assignee: Fujitsu Limited, Kanagawa, Japan

[21] Appl. No.: 08/961,182

[22] Filed: Oct. 30, 1997

[30] Foreign Application Priority Data

May 16, 1997 [JP] Japan ................................ 9-127585

[51] Int. Cl.[6] .............................. G06F 1/04; H03K 5/135
[52] U.S. Cl. ................................................. 713/503
[58] Field of Search ................. 395/558; 371/1; 327/161; 713/503; 714/700

[56] References Cited

U.S. PATENT DOCUMENTS 5,204,559   4/1993   Deyhimy et al. ................. 327/161 X
5,369,640  11/1994   Watson et al. ........................ 371/1
5,628,000   5/1997   Kashiyama et al. ................ 395/558

*Primary Examiner*—Thomas M. Heckler
*Attorney, Agent, or Firm*—Nikaido, Marmelstein, Murray & Oram, LLP

[57] ABSTRACT

A circuit for reducing skews includes a clock switching unit, receiving a clock signal, which outputs the clock signal in a first mode, and outputs a delayed clock signal obtained by delaying the clock signal in a second mode. The circuit further includes a skew reducing unit, receiving an input signal, which adjusts a phase of the input signal based on the clock signal from the clock switching unit in the first mode, and latches the input signal having an adjusted phase by using the delayed clock signal from the clock switching unit in the second mode.

24 Claims, 16 Drawing Sheets

SKEW-REDUCTION CIRCUIT AND SEMICONDUCTOR DEVICE

BACKGROUND OF THE INVENTION

1. Field of Invention

The present invention generally relates to semiconductor devices, and particularly relates to input/output interfaces of semiconductor devices.

2. Description of Related Art

In semiconductor devices, it is desirable to use high-frequency signals in data input/output so as to achieve high-speed operations. As frequencies of data input/output signals are raised with an aim of achieving high speed operations, however, various factors impeding an effort to raise the frequencies surface. It is required to eliminate these factors one by one.

One of the major factors limiting frequencies of data input/output signals is a signal skew, i.e., a displacement in a signal timing. When an input clock signal for signal synchronization has a skew relative to other signals, for example, it is possible that wrong signals are detected because of timing displacements when the clock signal is used for detecting the other signals. This possibility increases as a signal frequency becomes higher. Because of this, it is difficult to raise the operation speed by increasing the data-input/output signal frequency when a skew is existent between signals.

Causes of such inter-signal skews include a gap in signal timings which is created by differences in signal-path lengths. When a length of each signal line differs from each other, a timing of signal arrival at a receiver chip varies from signal to signal when a plurality of signals are transmitted from a given chip to the receiver chip. Even when the lengths of signal lines are the same, load factors such as path capacitances and path inductances are different between signal lines if these signal lines are laid out on different paths. Differences in such load factors result in differences in signal propagation speed. In this case, thus, signals receives at the receiver side end up containing skews.

Such signal skews do not surface as problems as long as signal frequencies are within a frequency range typically used in conventional DRAMs since such frequency range provides sufficient timing margins for detecting input data. As signal frequencies are raised to exceed about 200 MHz, however, inter-signal skews becomes significant in comparison with a timing margin to detect input data, and, thus, cannot be ignored anymore. This poses a limitation on how much the operation speed can be enhanced.

Accordingly, there is a need for a circuit which can reduce inter-signal skews.

SUMMARY OF THE INVENTION

Accordingly, it is a general object of the present invention to provide a circuit which can satisfy the need described above.

It is another and more specific object of the present invention to provide a circuit which can reduce inter-signal skews.

In order to achieve the above objects according to the present invention, a circuit for reducing skews includes a clock switching unit, receiving a clock signal, which outputs the clock signal in a first mode, and outputs a delayed clock signal obtained by delaying the clock signal in a second mode. The circuit further includes a skew reducing unit, receiving an input signal, which adjusts a phase of the input signal based on the clock signal from the clock switching unit in the first mode, and latches the input signal having an adjusted phase by using the delayed clock signal from the clock switching unit in the second mode.

The circuit described above aligns the phase of the input signal to the phase of the clock signal in the first mode for calibration, and reads the input signal into a latch by using the delayed clock signal having a delay as an appropriate setup time in the second mode for normal operations.

According to one aspect of the present invention, the phase of the input signal is adjusted based on the most delayed calibration pattern among a plurality of calibration patterns. In this case, data-read operations are free from errors even when a signal having a delayed timing is provided in the normal operation mode.

According to another aspect of the present invention, the phase of the input signal is adjusted based on an average timing calibration pattern among a plurality of calibration patterns. In this case, use of a ¼ cycle as a setup time makes it possible to position a data-read timing at a center of data-level changes.

According to yet another aspect of the present invention, a phase difference between the clock signal and the input signal is measured, and a delay commensurate with said phase difference is set to a delay line for delaying the input signal. In this case, if a calibration pattern is provided once, it is sufficient for calibration.

In this manner, skews between the clock signal and input signals are reduced to achieve reliable data-read operations.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to accompanying drawings.

Figure 1:
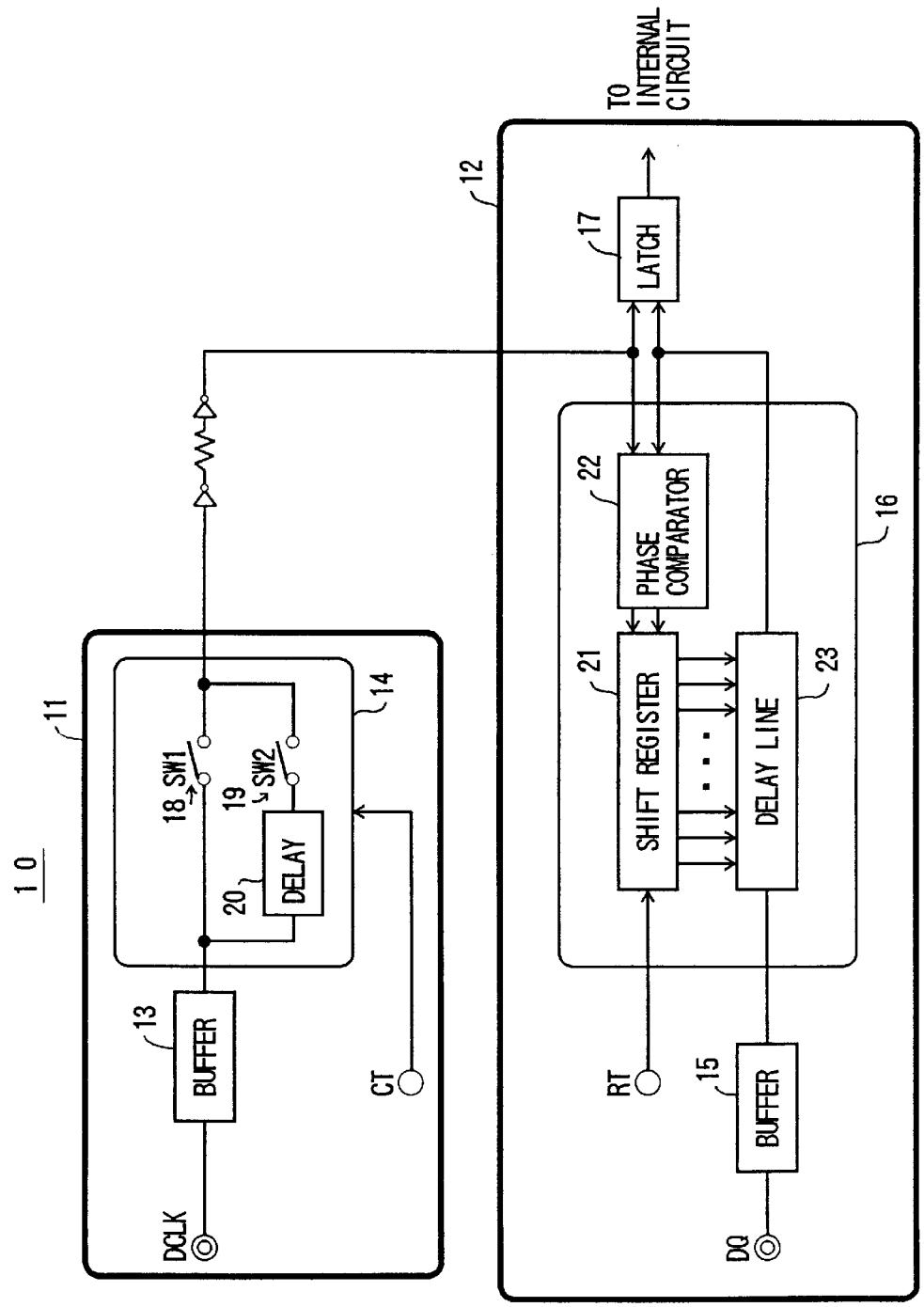
FIG. 1 is a block diagram of a first embodiment of a skew reducing circuit according to the present invention.

FIG. 1 is a block diagram of a first embodiment of a skew reducing circuit according to the present invention. A skew reducing circuit 10 of FIG. 1 includes a clock switching unit 11 and a skew reducing unit 12. The skew reducing circuit 10 of FIG. 1 is used in an input unit of a semiconductor device which receives input signals. In FIG. 1, the skew reducing unit 12 is provided for a pin which is used for receiving a data signal DQ. A plurality of the same skew reducing units 12 may be provided for a plurality of signal input pins.

The clock switching unit 11 includes a buffer 13 and a delay switching unit 14, and the delay switching unit 14 includes a switch 18, a switch 19, and a delay unit 20. In a calibration mode used for skew reduction, a clock signal DCLK input to the buffer 13 for data-signal synchronization is supplied to the skew reducing unit 12 via the switch 18. In a normal operation mode, the clock signal DCLK input to the buffer 13 is delayed by the delay unit 20 by a predetermined delay amount, and, then, is supplied to the skew reducing unit 12 via the switch 19. Switching between the calibration mode and the normal operation mode is performed by a control signal CT supplied to the delay switching unit 14. The control signal CT controls the opening and closing of the switches 18 and 19. In the calibration mode, the switches 18 and 19 are on and off, respectively. In the normal operation mode, on the other hand, the switches 18 and 19 are off and on, respectively.

The skew reducing unit 12 includes a buffer 15, a phase adjustment unit 16, and a latch 17. The phase adjustment unit 16 includes a shift register 21, a phase comparator 22, and a delay line 23.

In the calibration mode, the skew reducing unit 12 receives the clock signal DCLK from the clock switching unit 11, and receives the data signal DQ from an external source. The phase adjustment unit 16 of the skew reducing unit 12 compares phases between the clock signal DCLK and the data signal DQ, and adjusts the phase of the data signal DQ such that phases of the two signals becomes equal to each other. During this operation, a plurality of calibration patterns are supplied as the data signal DQ, and the phase of the data signal DQ is adjusted such that the clock signal DCLK has the same phase as the data signal DQ when the most delayed calibration pattern is supplied.

Namely, a plurality of calibration patterns P1 through Pn are provided as the data signal DQ. The most delayed pattern among the calibration patterns P1 through Pn is denoted as Pm. In the phase adjustment unit 16, the delay line 23 delays the calibration patterns P1 through Pn, and the phase comparator 22 compares the phase of the clock signal DCLK with the phase of the calibration patterns P1 through Pn. The shift register 21 is a circuit for adjusting the amount of delay introduced by the delay line 23. Based on phase-comparison results of the phase comparator 22, the shift register 21 adjusts the amount of delay introduced by the delay line 23. Through this adjustment, the amount of delay in the delay line 23 is determined such that the calibration pattern Pm has the same phase as the clock signal DCLK.

Figure 2:
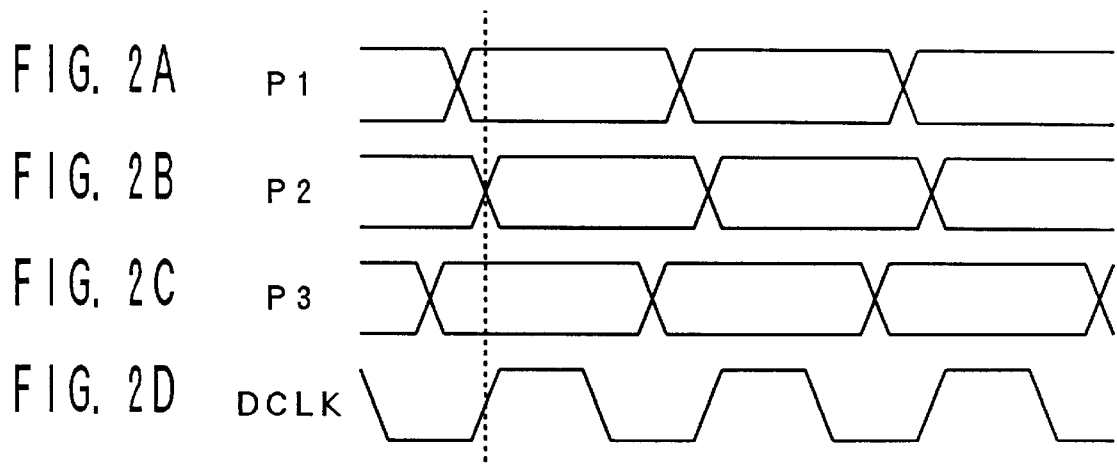
FIGS. 2A through 2D are timing charts for explaining a phase adjustment by the phase adjustment unit of FIG. 1.

FIGS. 2A through 2D are timing charts for explaining the phase adjustment by the phase adjustment unit 16. FIGS. 2A through 2C show the calibration patterns P1 through P3, respectively, among which the calibration pattern P2 is the most delayed. The phase adjustment of the phase adjustment unit 16 adjusts the amount of delay in the delay line 23 such that the clock signal DCLK has the same phase as the most delayed calibration pattern P2, as shown by a dotted line in the figures.

The calibration patterns P1 through Pn are different from each other. When signal pattern are different, timings of signal-level changes in received signals also exhibit slight differences from signal to signal because of capacitance between adjacent signal-input pins and the varying signal driving capacity of the signal output side. In the first embodiment, the phase adjustment is carried out based on the most delayed calibration pattern Pm in the calibration mode. This ensures that the clock signal DCLK can detect correct data even when delayed signals are input in the normal operation mode.

With reference to FIG. 1 again, the skew reducing unit 12 in the normal operation mode receives a delayed clock signal DCLK from the clock switching unit 11. The latch 17 of the skew reducing unit 12 latches the data signal DQ supplied via the buffer 15 and the delay line 23 by using the delayed clock signal DCLK as a synchronization signal. Here, the delayed clock signal DCLK is delayed by an amount equal to a setup time. The data signal DQ supplied from the delay line 23 has already been adjusted in the calibration mode so as to exhibit the same phase as the clock signal DCLK with no delay. Because of this, use of a rising edge of the delayed clock signal DCLK to define a timing to read data, for example, makes it possible to read the data signal DQ in the normal operation mode. The data read by the latch 17 is supplied to internal circuits.

As described above, the skew reducing circuit 10 of the first embodiment shown in FIG. 1 aligns the phase of the clock signal DCLK with the phase of the data signal DQ in the calibration mode, and uses the clock signal DCLK delayed by an amount equal to the setup time for reading the data signal DQ in the normal operation mode. In doing so, the phase adjustment of the data signal DQ is performed such that the phase match is obtained with respect to the most delayed calibration pattern. The data-read operation is thus free from errors even when delayed signals are supplied in the normal operation mode. It should be noted that the skew reducing circuit 10 of FIG. 1 may be used for skew reduction not only for data signals but also for address signals or the like in semiconductor memory devices or the like.

The phase adjustment unit 16 of FIG. 1 has the same configuration as a DLL (delay locked loop) circuit which is widely used for phase adjustment of clock signals in semiconductor devices. In such a DLL circuit, an amount of delay in a delay line of the DLL circuit can be increased or decreased, whichever is appropriate. The phase adjustment unit 16 of FIG. 1, on the other hand, only has a function to reduce an amount of delay from an initial delay amount.

Figure 3:
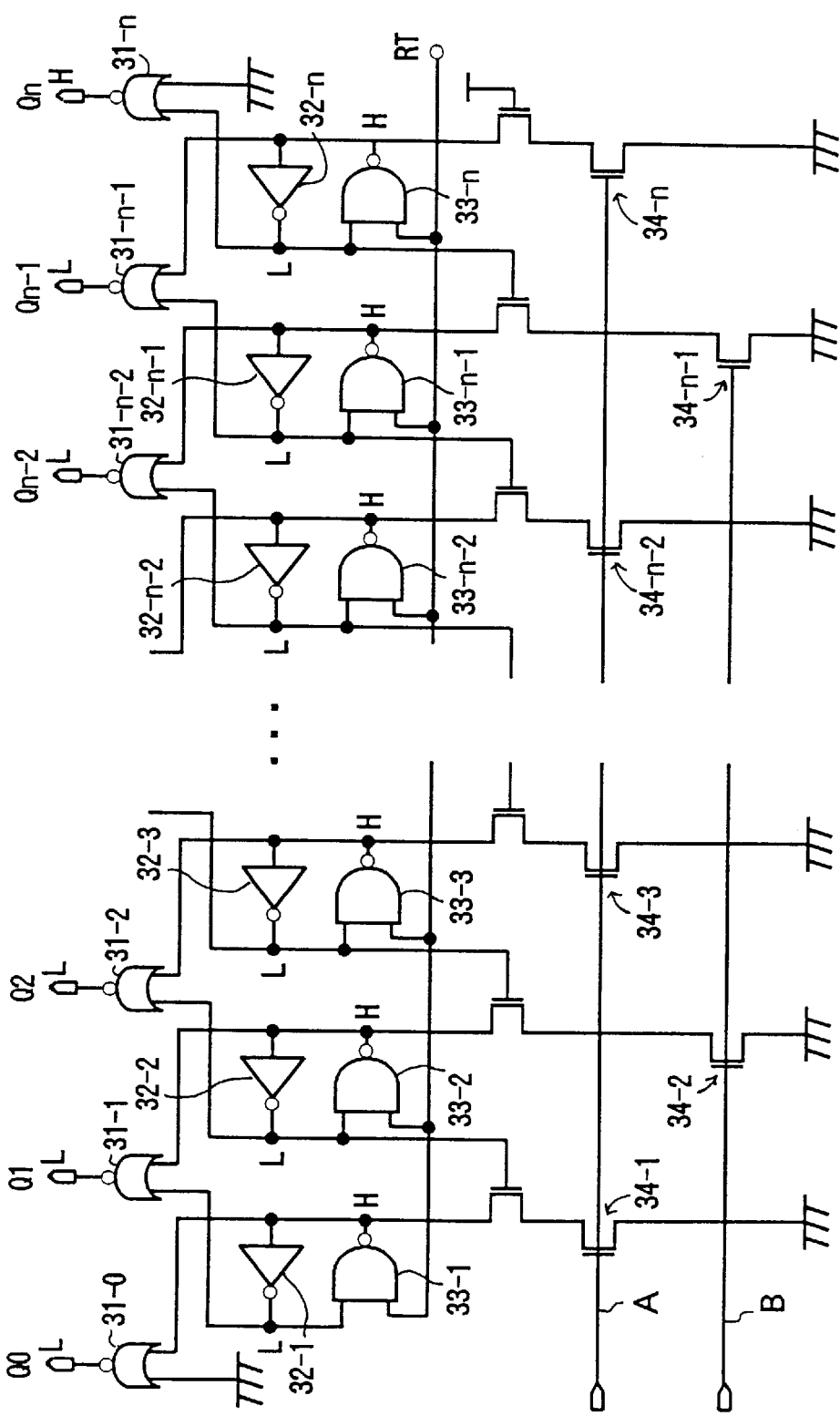
FIG. 3 is a circuit diagram of a shift register of the phase adjustment unit shown in FIG. 1.

FIG. 3 is a circuit diagram of the shift register 21 of the phase adjustment unit 16 shown in FIG. 1. The shift register 21 includes NOR circuits 31-0 through 31-n, inverters 32-1 through 32-n, NAND circuits 33-1 through 33-n, and NMOS transistors 34-1 through 34-n. When a reset signal RST is turned to LOW, the shift register 21 is reset. Namely, when the reset signal RT becomes LOW, outputs of the NAND circuits 33-1 through 33-n become HIGH, and outputs of the inverters 32-1 through 32-n become LOW. A pair of a given one of the NAND circuits 33-1 through 33-n and a corresponding one of the inverters 32-1 through 32-n forms a latch in which one element of the pair receives an output of the other element as an input. An initial state created by the reset signal RT is thus kept even after the reset signal RT returns to HIGH.

In this initial state, an output Qn of the NOR circuit 31-n is HIGH, and the remaining NOR circuits 31-0 through 31-n-1 have outputs Q0 through Qn-1, respectively, which are LOW. That is, only the output Qn is HIGH among the outputs Q0 through Qn.

When there is a need to decrease the amount of delay, HIGH pulses are supplied to signal lines A and B in turn. With a HIGH pulse supplied to the signal line A, the NMOS transistor 34-n is turned on. An output of the NAND circuit 33-n is thus connected to the ground, and is forced to change from HIGH to LOW, so that an output of the inverter 32-n becomes HIGH. This condition is latched by the latch comprising the NAND circuit 33-n and the inverter 32-n. As a result, the output Qn is changed from HIGH to LOW, while the output Qn-1 is turned from LOW to HIGH. In this condition, therefore, only the output Qn-1 is HIGH.

With a HIGH pulse supplied to the signal line B, the NMOS transistor 34-n-1 is turned on. An output of the NAND circuit 33-n-1 is thus connected to the ground, and is forced to change from HIGH to LOW, so that an output of the inverter 32-n-1 becomes HIGH. This condition is latched by the latch comprising the NAND circuit 33-n-1 and the inverter 32-n-1. As a result, the output Qn-1 is changed from HIGH to LOW, while the output Qn-2 is turned from LOW to HIGH. In this condition, therefore, only the output Qn-2 is HIGH.

As described above, HIGH pulses are supplied in turn to the signal lines A and B to shift an output Qx to the left, where the output Qx is the only one of the outputs Q0 through Qn which is HIGH.

The output signals Q1 through Qn are supplied to the delay line 23 to adjust the amount of signal delay. The HIGH pulses which are applied to the signal lines A and B in turn are provided by the phase comparator 22. The phase comparator 22 compares the clock signal DCLK with the output of the delay line 23, and supplies the pulses to the signal lines A and B in turn so as to reduce the amount of delay in the delay line 23 when the phase of the clock signal DCLK is ahead in time. In what follows, a configuration of the phase comparator 22 will be described.

Figure 4:
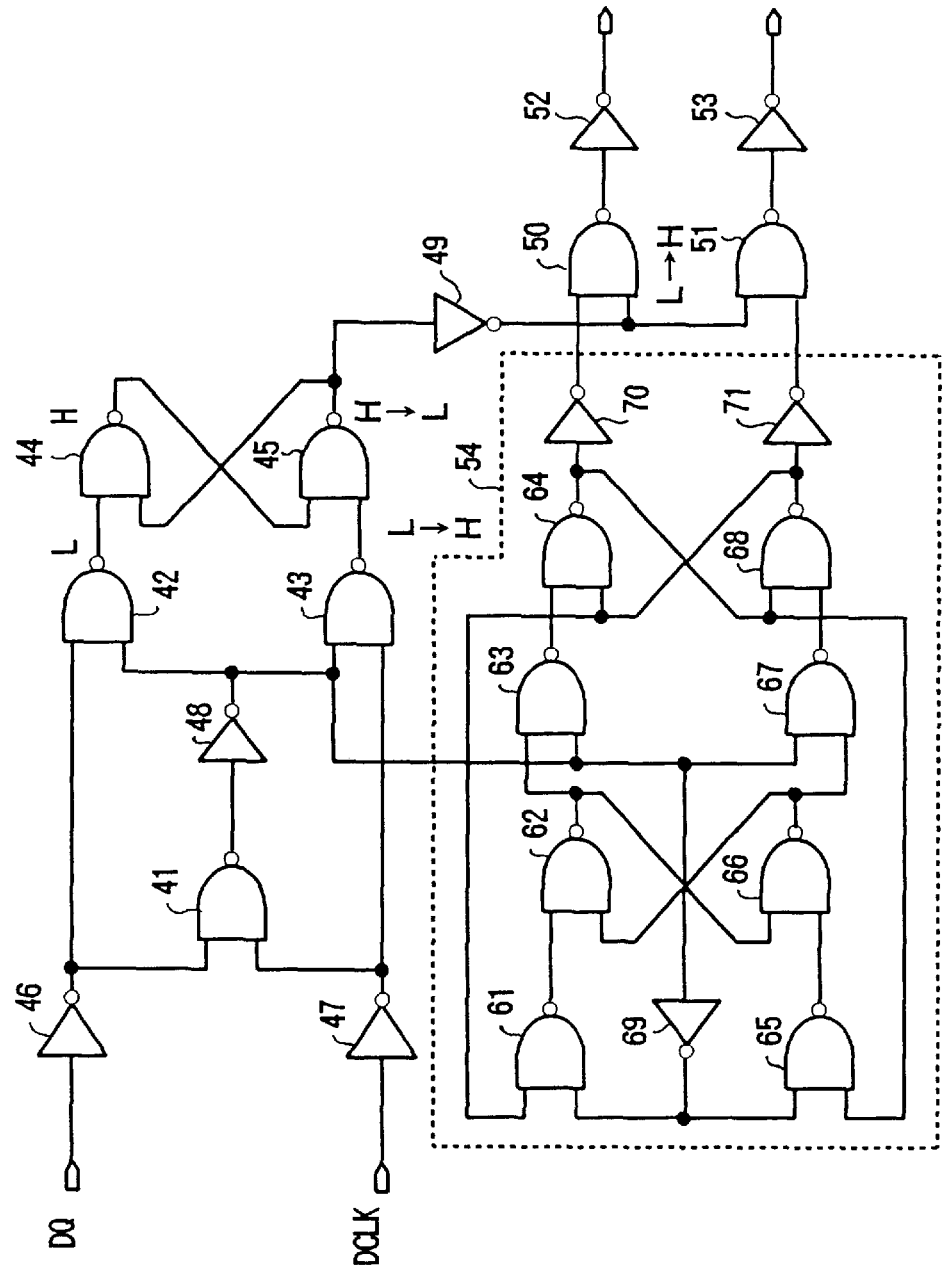
FIG. 4 is a circuit diagram of a phase comparator of the phase adjustment unit shown in FIG. 1.

FIG. 4 is a circuit diagram of the phase comparator 22 of the phase adjustment unit 16 shown in FIG. 1.

The phase comparator 22 includes NAND circuits 41 through 45, inverters 46 through 49, NAND circuits 50 and 51, inverters 52 and 53, and a binary counter 54. The NAND circuits 44 and 45 together form a latch. This latch has two LOW inputs and two HIGH outputs in an initial condition as shown in FIG. 4. When a rising edge of the clock signal DCLK is ahead of a rising edge of the data signal DQ from the delay line 23, the output of the NAND circuit 43 becomes HIGH ahead of the output of the NAND circuit 42. The output of the NAND circuit 45 thus becomes LOW, while the NAND circuit 44 keeps the HIGH output thereof. This condition is latched by the latch, and, thus, does not change even when the output of the NAND circuit 42 is turned to HIGH by the rising edge of the data signal DQ. As a result, an output of the inverter 49 is HIGH when the clock signal DCLK has a phase which is ahead in time. Conversely, when the phase of the data signal DQ is ahead in time, the output of the inverter 49 remains LOW.

A signal from the inverter 48 serves to bring the latch to the initial condition at an appropriate timing by simultaneously turning the outputs of the NAND circuits 42 and 43 to LOW. If this configuration was not in place, the outputs of the NAND circuits 42 and 43 would become HIGH successively in this order when the phase of the data signal DQ was ahead in time, and, then, the condition of the latch would be reversed when the data signal DQ became LOW ahead of the clock signal DCLK, thereby providing a LOW output from the NAND circuit 45. In order to avoid this, the outputs of the NAND circuits 42 and 43 are changed to LOW at the same time.

The output of the inverter 48 is also provided to the binary counter 54. The binary counter 54 has two outputs which become HIGH in turn at every cycle of the clock signal DCLK. The binary counter 54 includes NAND circuits 61 through 68 and inverters 69 through 71. Operations of the binary counter 54 are well within the scope of ordinary skill in the art, and a description thereof will be omitted. The two outputs of the binary counter 54 are supplied to one of the two inputs of the NAND circuits 50 and 51, respectively.

The other input of the NAND circuits 50 and 51 receives the output of the inverter 49.

Accordingly, when the clock signal DCLK has a phase ahead of the phase of the data signal DQ, the inverters 52 and 53, which invert outputs of the NAND circuits 50 and 51, respectively, provide HIGH pulses in turn. On the other hand, when the phase of the data signal DQ is ahead in time, the outputs of the inverters 52 and 53 remain LOW at all times.

The outputs of the inverters 52 and 53 are supplied to the signal lines A and B of the shift register 21 shown in FIG. 3 so as to shift the output Qx to the left one by one. Here, the output Qx is only one of the outputs Q1 through Qn which is HIGH, as previously noted. The output signals Q1 through Qn are provided to the delay line 23 for adjustment of signal delays.

Figure 5:
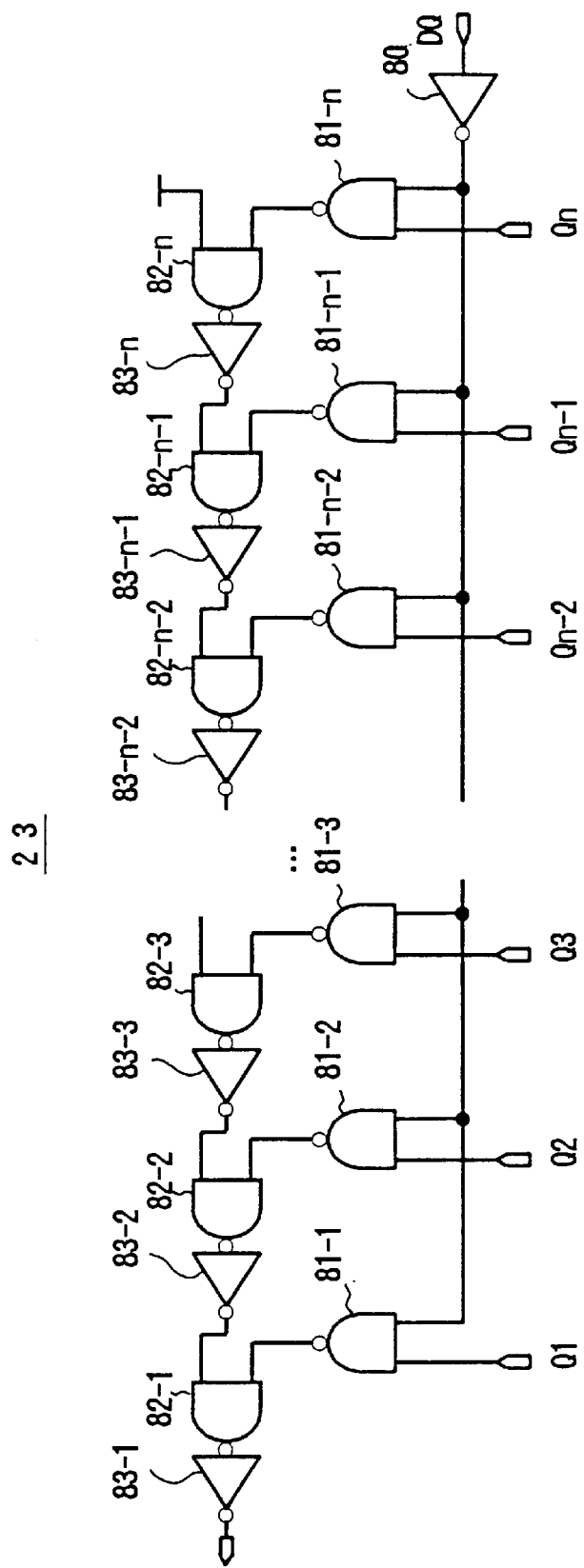
FIG. 5 is a circuit diagram of a delay line.

FIG. 5 is a circuit diagram of the delay line 23.

The delay line 23 includes an inverter 80, NAND circuits 81-1 through 81-n, NAND circuits 82-1 through 82-n, and inverters 83-1 through 83-n. The NAND circuits 82-1 through 82-n and the inverters 83-1 through 83-n form a delay line (a series of delay elements).

The NAND circuits 81-1 through 81-n have one input for receiving an inverse of the data signal DQ from the inverter 80, and have the other input which is provided with the signals Q1 through Qn, respectively. Only one signal which is HIGH among the signals Q1 through Qn is denoted as Qx.

The NAND circuits 81-1 through 81-n, except for the NAND circuit 81-x, have one input which is LOW, and, thus, have a HIGH output. The NAND circuits 82-1 through 82-n, except for the NAND circuit 82-x, receive this HIGH output at one input thereof, thereby serving as in inverter to the other output thereof.

Accordingly, the delay line from the NAND circuit 82-n to the inverter 83-x+1 allows a fixed HIGH level to propagate therethrough when this fixed HIGH level is supplied to one input of the NAND circuit 82-n. The NAND circuit 82-x thus receives the fixed HIGH level at one input thereof. The other input of the NAND circuit 82-x receives the data signal DQ via the inverter 80 and the NAND circuit 81-x. The delay line from the NAND circuit 82-x to the inverter 83-1 allows the data signal DQ to propagate therethrough with some delays, thereby providing a delayed data signal DQ as an output. The output in this case is delayed by a delay amount commensurate with x stages of delay elements in comparison with the input signal.

As was described in connection with the shift register 21 of FIG. 3, the signal Qx, which is the only one HIGH signal among the signals Q1 through Qn, can shift its position within a range of $1 \leq x \leq n$. Because of this, use of the delay line 23 of FIG. 5 makes it possible to adjust the delay time of the data signal DQ.

Use of the shift register 21, the phase comparator 22, and the delay line 23 described above makes it possible to align a phase of the clock signal DCLK to the most delayed calibration pattern Pm by gradually decreasing the amount of delay of the delay line 23 from a maximum delay amount when the calibration patterns P1 through Pn are supplied to the skew reducing circuit 10 of FIG. 1. In order to make sure that the phase of the clock signal DCLK is aligned with the most delayed calibration pattern Pm, the calibration patterns P1 through Pn need to be repeatedly supplied many times. When an appropriate delay amount is equivalent to one stage of delay elements of FIG. 5, for example, the number of times that the calibration patterns are supplied should be at least equal to the number of stages of the delay elements. In doing so, only one signal which is HIGH among the signals Q1 through Qn is shifted successively from the signal Qn at an initial position to the signal Q1 at a final position.

Figure 6:
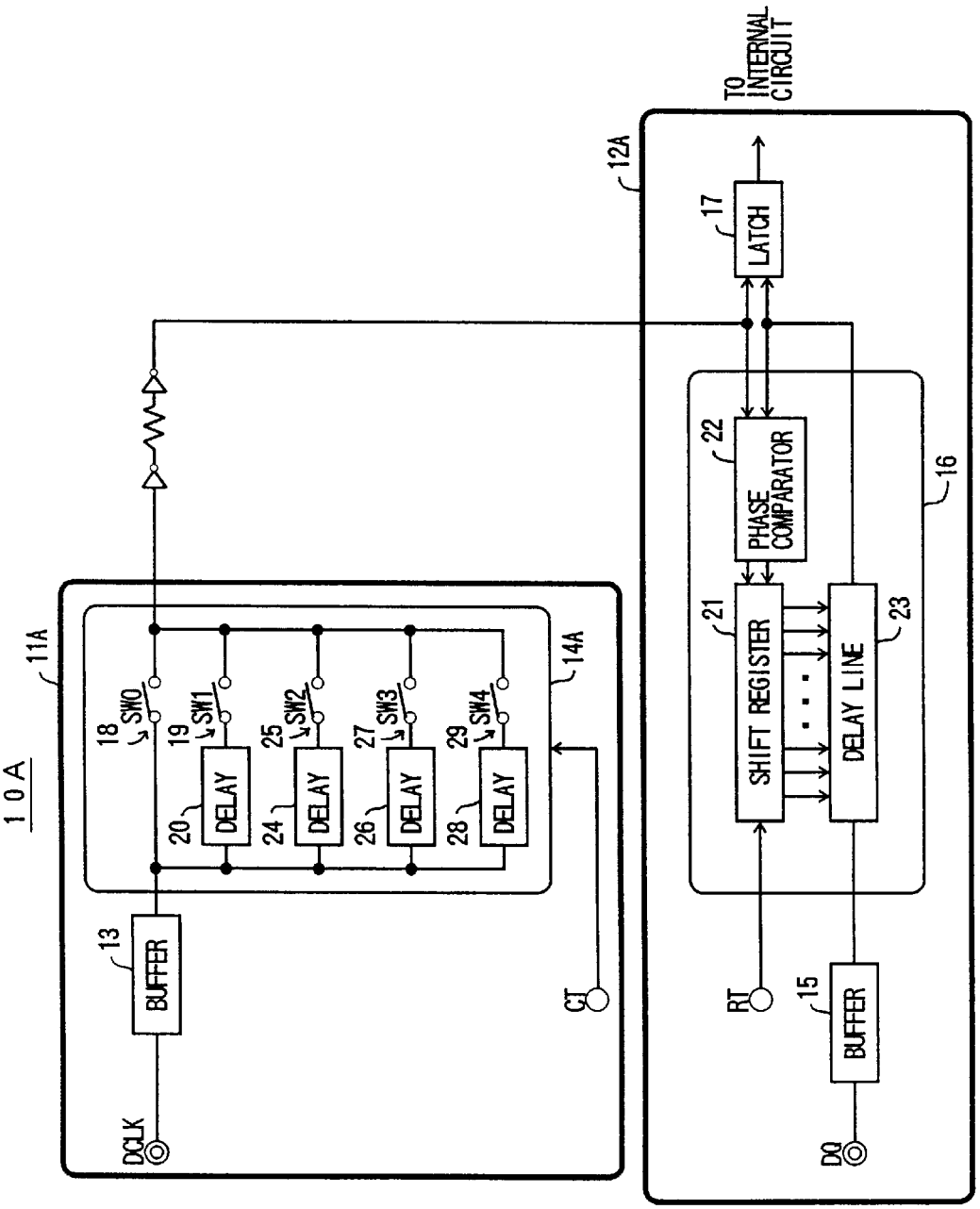
FIG. 6 is a block diagram of a second embodiment of a skew reducing circuit according to the present invention.

FIG. 6 is a block diagram of a second embodiment of a skew reducing circuit according to the present invention. In FIG. 6, the same elements as those of FIG. 1 are referred to by the same numerals, and a description thereof will be omitted.

A skew reducing circuit 10A of FIG. 6 includes a clock switching unit 11A and the skew reducing unit 12.

The clock switching unit 11A includes the buffer 13 and a delay switching unit 14A. The delay switching unit 14A includes delay units 24, 26, and 28 and switches 25, 27, and 29 in addition to the switches 18 and 19 and the delay unit 20.

In the calibration mode for skew reduction, the clock signal DCLK supplied to the buffer 13 for data-signal synchronization is provided to the skew reducing unit 12 via the switch 18. In the normal operation mode, the clock signal DCLK input to the buffer 13 is delayed by a delay amount of a selected one of the delay units 20, 24, 26, and 28, and is fed to the skew reducing unit 12 via a corresponding one of the switches 19, 25, 27, and 29. Switching of operations between the calibration mode and the normal operation mode, as well as selection of a delay unit and a switch in the normal operation mode, are controlled by the control signal CT supplied to the delay switching unit 14A.

In the skew reducing circuit 10A of FIG. 6, a setup time (delay amount) of the clock signal DCLK in the normal operation mode is determined by selecting one of the delay units 20, 24, 26, and 28. Because of this, an appropriate setup time can be selected depending on various factors such as frequencies of the clock signal DCLK and the data signal DQ.

Figure 7:
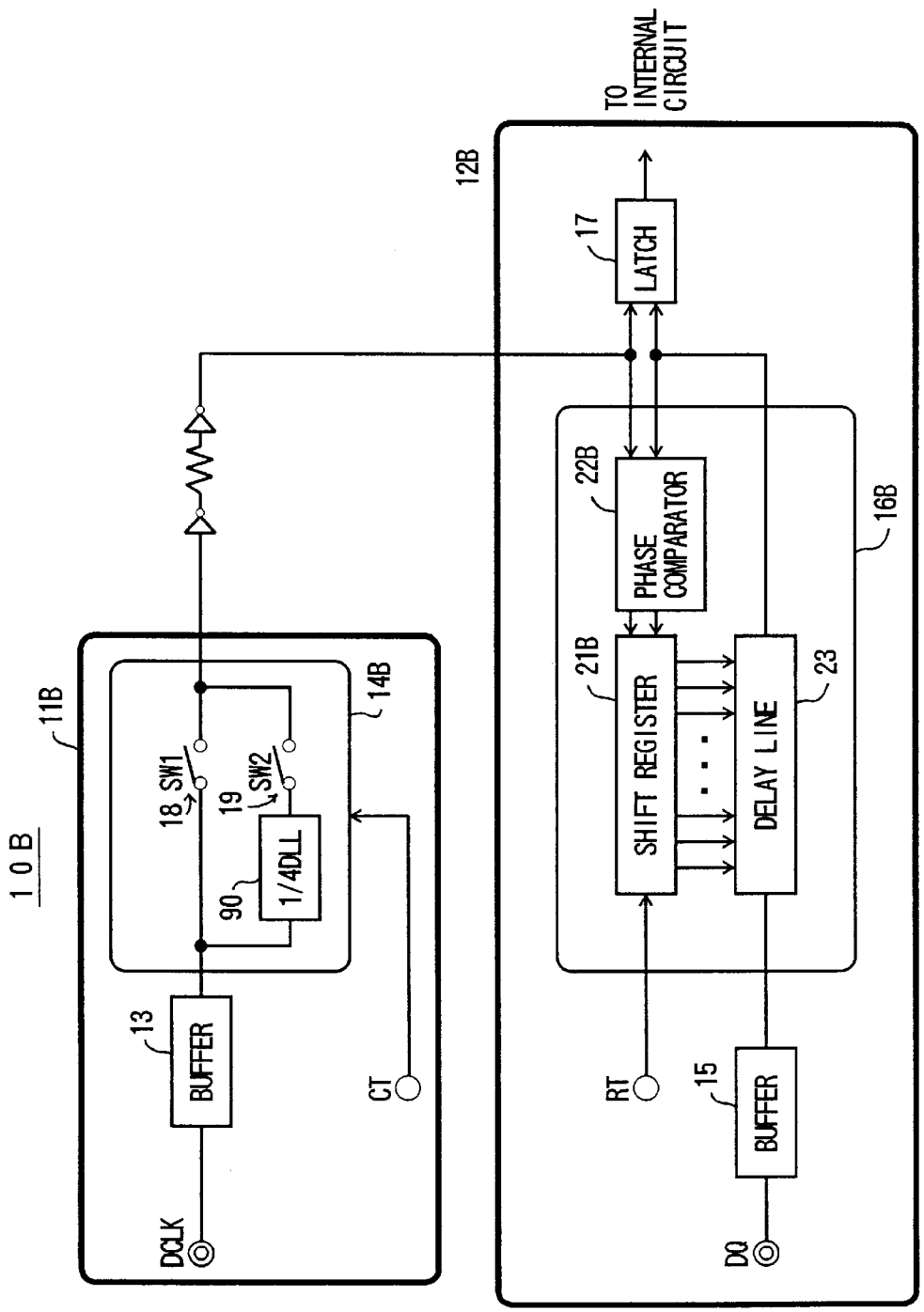
FIG. 7 is a block diagram of a third embodiment of a skew reducing circuit according to the present invention.

FIG. 7 is a block diagram of a third embodiment of a skew reducing circuit according to the present invention. In FIG. 7, the same elements as those of FIG. 1 are referred to by the same numerals, and a description thereof will be omitted.

A skew reducing circuit 10B of FIG. 7 includes a clock switching unit 11B and a skew reducing unit 12B.

The clock switching unit 11B includes the buffer 13 and a delay switching unit 14B. The delay switching unit 14B includes the switches 18 and 19 and a ¼-DLL unit 90. In the calibration mode for skew reduction, the clock signal DCLK supplied to the buffer 13 for data-signal synchronization is provided to the skew reducing unit 12B via the switch 18. In the normal operation mode, the clock signal DCLK input to the buffer 13 is delayed by a ¼ cycle (90° in phase) by the ¼-DLL unit 90, and is fed to the skew reducing unit 12B via the switch 19. Switching of operations between the calibration mode and the normal operation mode is controlled by the control signal CT, which is supplied to the delay switching unit 14B to control the opening and closing of the switches 18 and 19.

The skew reducing unit 12B includes the buffer 15, a phase adjustment unit 16B, and the latch 17. The phase adjustment unit 16B includes a shift register 21B, a phase comparator 22B, and the delay line 23. As will be described later, the phase adjustment unit 16B is a DLL circuit which is capable of adjusting the delay of the delay line 23 in either one of the increasing direction and the decreasing direction.

In the calibration mode, the phase adjustment unit 16B of the skew reducing unit 12B compares phases between the clock signal DCLK and the data signal DQ, and adjusts the phase of the data signal DQ such that both signals have the same phase. Here, a plurality of calibration patterns are supplied as the data signal DQ, and the phase adjustment of the data signal DQ is performed such that the phase of the clock signal DCLK becomes the same as that of the data signal DQ when a calibration pattern having an average timing is supplied.

Namely, a plurality of calibration patterns P1 through Pn are provided as the data signal DQ. An average timing pattern among the calibration patterns P1 through Pn is denoted as Pa. In the phase adjustment unit 16B, the delay line 23 delays the calibration patterns P1 through Pn, and the phase comparator 22B compares the phase of the clock signal DCLK with the phase of the calibration patterns P1 through Pn. The shift register 21B adjusts the amount of delay introduced by the delay line 23 based on phase-comparison results of the phase comparator 22B. Through this adjustment, the amount of delay in the delay line 23 is determined such that the average timing calibration pattern Pa has the same phase as the clock signal DCLK.

The phase adjustment unit 16B is capable of adjusting the delay of the delay line 23 to increase the delay or decrease the delay, whichever is necessary. After phase adjustment using each of the calibration patterns P1 through Pn, therefore, the delay of the delay line 23 should be close to an average of delays with respect to the calibration patterns P1 through Pn. That is, after the phase adjustment using the calibration patterns P1 through Pn, there is a high probability that the phase of the clock signal DCLK is about the same as that of the average timing calibration pattern Pa.

In order to increase the probability that the phase of the clock signal DCLK coincides with the phase of the average timing calibration pattern Pa, the calibration patterns P1 through Pn need to be supplied in a random order. Further, when an appropriate delay amount is equivalent to one stage of delay elements of the delay line 23, for example, the number of times that the calibration patterns are supplied should be at least equal to the number of stages of the delay elements. In doing so, the amount of delay needs to be gradually decreased from a total delay amount of all the stages in an initial condition to a delay amount of one stage in the end.

With reference to FIG. 7, the skew reducing unit 12B in the normal operation mode receives the clock signal DCLK with a ¼-cycle delay from the clock switching unit 11B. The latch 17 of the skew reducing unit 12B latches the data signal DQ supplied via the buffer 15 and the delay line 23 by using the ¼-cycledelayed clock signal DCLK as a synchronization signal.

The ¼-cycle delay provides an appropriate setup time under a condition that the average timing of the data signal DQ from the delay line 23 is aligned to the clock signal DCLK. A system which uses both rising edges and falling edges of the clock signal DCLK for synchronization, in particular, should find it convenient to use ¼ delay since this delay positions a data-read timing at a center of data-level changes.

As described above, the skew reducing circuit 10B of the third embodiment shown in FIG. 7 aligns the phase of the clock signal DCLK with the phase of the data signal DQ in the calibration mode, and uses the clock signal DCLK delayed by an amount equal to the ¼-cycle setup time for reading the data signal DQ in the normal operation mode. In doing so, the phase adjustment of the data signal DQ is performed such that the phase match is substantially obtained with respect to the average timing calibration pattern. The ¼-cycle setup time thus achieves appropriate data-read operations in the normal operation mode.

Figure 8:
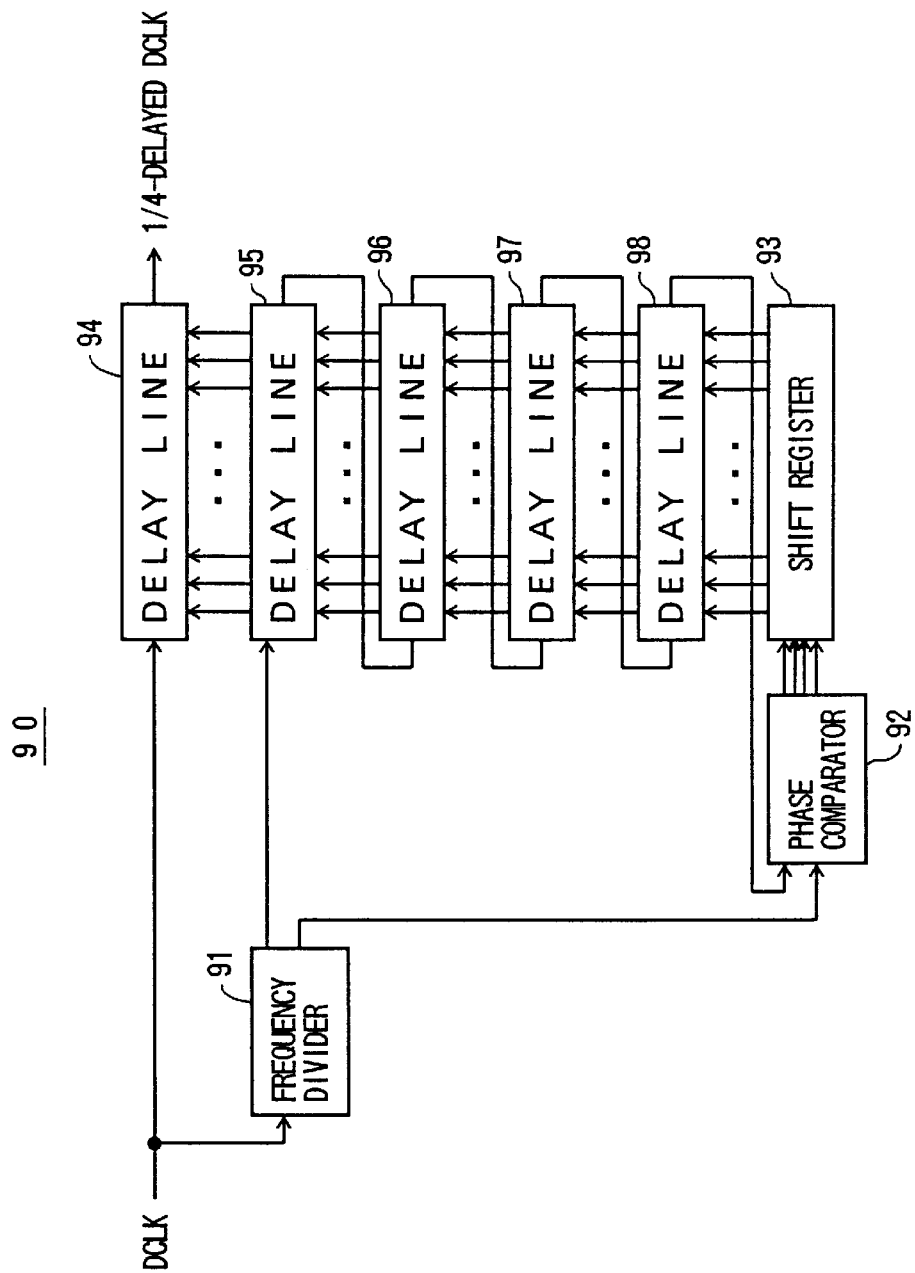
FIG. 8 is a block diagram of a ¼-DLL unit of a clock switching unit shown in FIG. 7.

FIG. 8 is a block diagram of the ¼-DLL unit 90 of the clock switching unit 11B shown in FIG. 7. The ¼-DLL unit 90 of FIG. 8 includes a frequency divider 91, a phase comparator 92, a shift register 93, and delay lines 94 through 98 which are identical to each other.

The clock signal DCLK is supplied to the frequency divider 91, and is subjected to frequency division. A frequency-divided signal is directly supplied to the phase comparator 92, and, also, is provided to the phase comparator 92 via the delay lines 95 through 98. Each of the delay lines 95 through 98 introduces the same delay T, so that a total delay is 4T. The phase comparator 92 compares phases between the frequency-divided signal with the delay 4T and the frequency-divided signal with no delay, and controls the shift register 93 to make the phases equal between the two signals. After completion of the phase adjustment, the frequency-divided signal with the delay 4T ends up having a phase displacement of 360° with the frequency-divided signal having no delay.

The clock signal DCLK is supplied to the delay line 94, which is controlled by the shift register 93 to have the same delay as each of the delay lines 95 through 98. The delay of the delay line 94 is T. Since the delay 4T is tantamount to 360°, the clock signal DCLK has a 90° (¼ cycle) delay after passing through the delay line 94.

Figure 9:
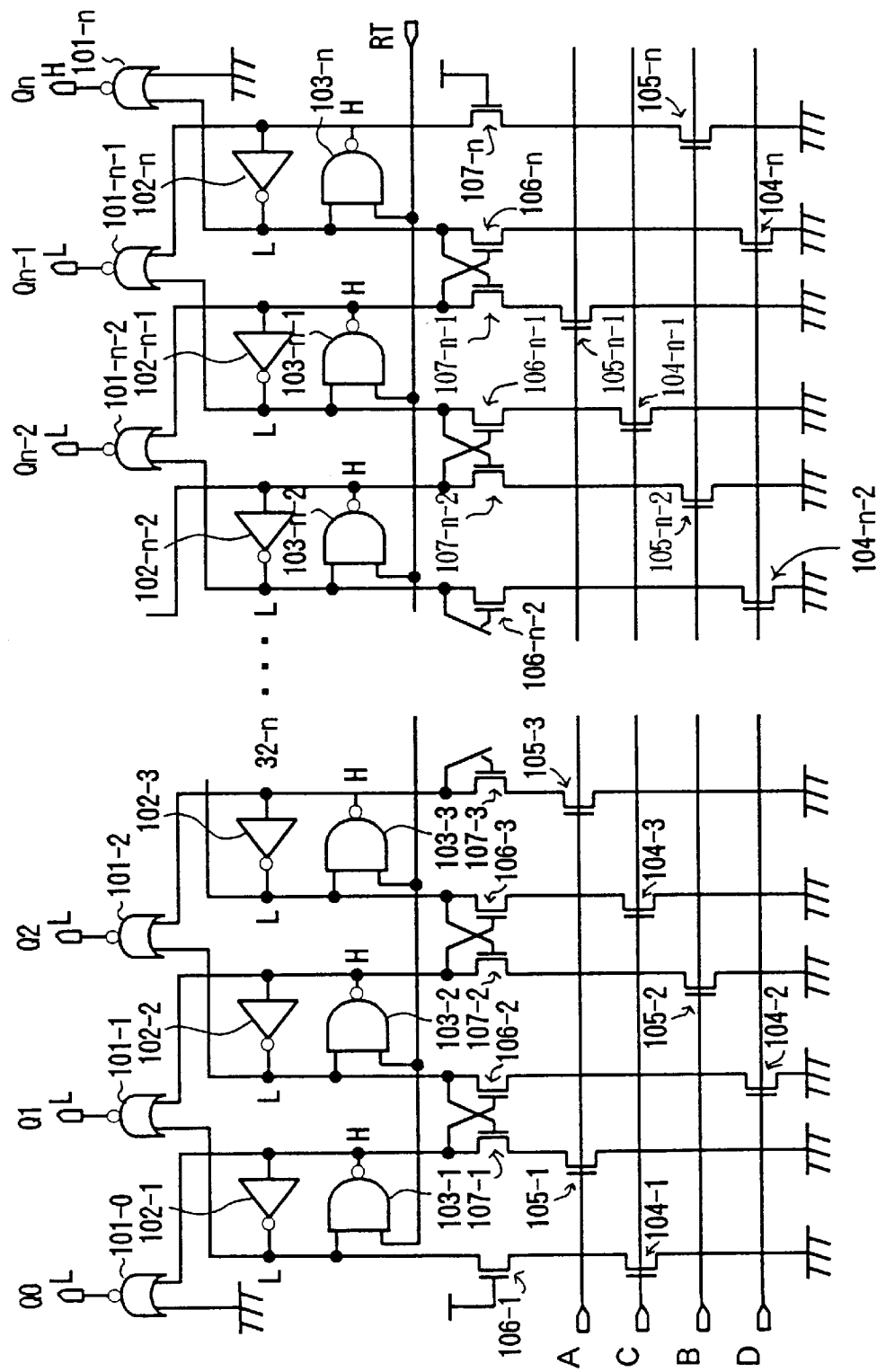
FIG. 9 is a circuit diagram of a shift register of FIG. 7.

FIG. 9 is a circuit diagram of the shift register 21B of FIG. 7.

The shift register 21B of FIG. 9 includes NOR circuits 101-0 through 101-n, inverters 102-1 through 102-n, NAND circuits 103-1 through 103-n, NMOS transistors 104-1 through 104-n, NMOS transistors 105-1 through 105-n, NMOS transistors 106-1 through 106-n, and NMOS transistors 107-1 through 107-n. When a reset signal RT is turned to LOW, the shift register 21B is reset. Namely, when the reset signal RT becomes LOW, outputs of the NAND circuits 103-1 through 103-n become HIGH, and outputs of the inverters 102-1 through 102-n become LOW. A pair of a given one of the NAND circuits 103-1 through 103-n and a corresponding one of the inverters 102-1 through 102-n forms a latch in which one element of the pair receives an output of the other element as an input. An initial state created by the reset signal RT is thus kept even after the reset signal RT returns to HIGH.

In this initial state, an output Qn of the NOR circuit 101-n is HIGH as shown in FIG. 9, and the remaining NOR circuits 101-0 through 101-n-1 have outputs Q0 through Qn-1, respectively, which are LOW. That is, only the output Qn is HIGH among the outputs Q0 through Qn.

When there is a need to decrease the amount of delay, HIGH pulses are supplied to signal lines A and B in turn. With a HIGH pulse supplied to the signal line B, the NMOS transistor 105-n is turned on. Since the NMOS transistor 107-n is in a turned-on state, an output of the NAND circuit 103-n is connected to the ground, and is forced to change from HIGH to LOW, so that an output of the inverter 102-n becomes HIGH. This condition is latched by the latch comprising the NAND circuit 103-n and the inverter 102-n. As a result, the output Qn is changed from HIGH to LOW, while the output Qn-1 is turned from LOW to HIGH. In this condition, therefore, only the output Qn-1 is HIGH.

With a HIGH pulse supplied to the signal line A, the NMOS transistor 105-n-1 is turned on. Since the NMOS transistor 107-n-1 is already in a turned-on state, an output of the NAND circuit 103-n-1 is connected to the ground, and is forced to change from HIGH to LOW, so that an output of the inverter 102-n-1 becomes HIGH. This condition is latched by the latch comprising the NAND circuit 103-n-1 and the inverter 102-n-1. As a result, the output Qn-1 is changed from HIGH to LOW, while the output Qn-2 is turned from LOW to HIGH. In this condition, therefore, only the output Qn-2 is HIGH.

As described above, HIGH pulses are supplied in turn to the signal lines A and B to shift an output Qx to the left, where the output Qx is the only one of the outputs Q0 through Qn which is HIGH.

When there is a need to increase the delay amount, HIGH pulses are supplied to signal lines C and D in turn. Operations in this case are simply a reverse of the above-described operations, and a description thereof will be omitted.

The output signals Q1 through Qn are supplied to the delay line 23 shown in FIG. 5 so as to adjust a delay of signals by increasing the delay or decreasing the delay, whichever is needed.

The HIGH pulses which are applied to the signal lines A through D are provided by the phase comparator 22B. The phase comparator 22B compares the clock signal DCLK with the output of the delay line 23, and supplies the pulses to the signal lines A and B in turn so as to reduce the amount of delay in the delay line 23 when the phase of the clock signal DCLK is ahead in time. On the other hand, when the phase of the clock signal DCLK is behind in time, the phase comparator 22B supplies the pulses to the signal lines C and D in turn so as to increase the amount of delay in the delay line 23. In what follows, a configuration of the phase comparator 22B will be described.

Figure 10:
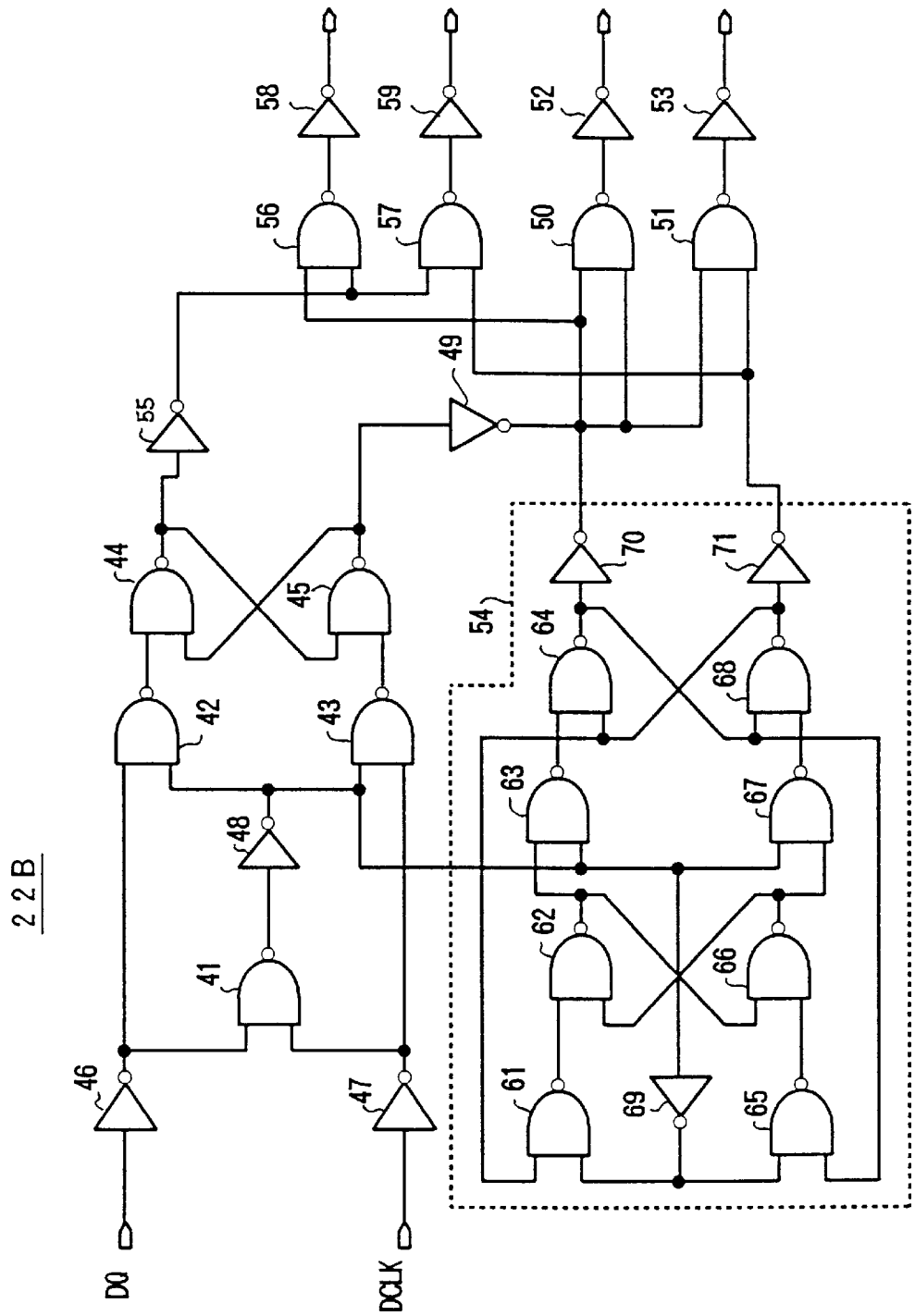
FIG. 10 is a circuit diagram of a phase comparator.

FIG. 10 is a circuit diagram of the phase comparator 22B. In FIG. 10, the same elements as those of FIG. 4 are referred to by the same numerals, and a description thereof will be omitted.

The phase comparator 22B includes an inverter 55, NAND circuits 56 and 57, and inverters 58 and 59 in addition to the phase comparator 22 of FIG. 4. In the same manner as in FIG. 4, the inverters 52 and 53 output HIGH pulses in turn when the phase of the clock signal DCLK is ahead of the phase of the data signal DQ. On the other hand, when the phase of the data signal DQ is ahead in time, the inverters 58 and 59 provide HIGH pulses in turn.

The outputs of the inverters 52 and 53 are provided for the signal lines A and B, respectively, of the shift register 21B shown in FIG. 9. In this case, the output Qx, which is the only HIGH signal among the outputs Q1 through Qn, is shifted to the left one by one. The outputs of the inverters 58 and 59 are supplied to the signal lines C and D, respectively, so that the output Qx, which is the only HIGH signal among the outputs Q1 through Qn, is shifted to the right one by one. The output signals Q1 through Qn are fed to the delay line 23 for adjustment of signal delays.

Use of the shift register 21B, the phase comparator 22B, and the delay line 23 described above makes it possible to align a phase of the clock signal DCLK to the average timing calibration pattern Pa when the calibration patterns P1 through Pn are supplied to the skew reducing circuit 10B of FIG. 7.

Figure 11:
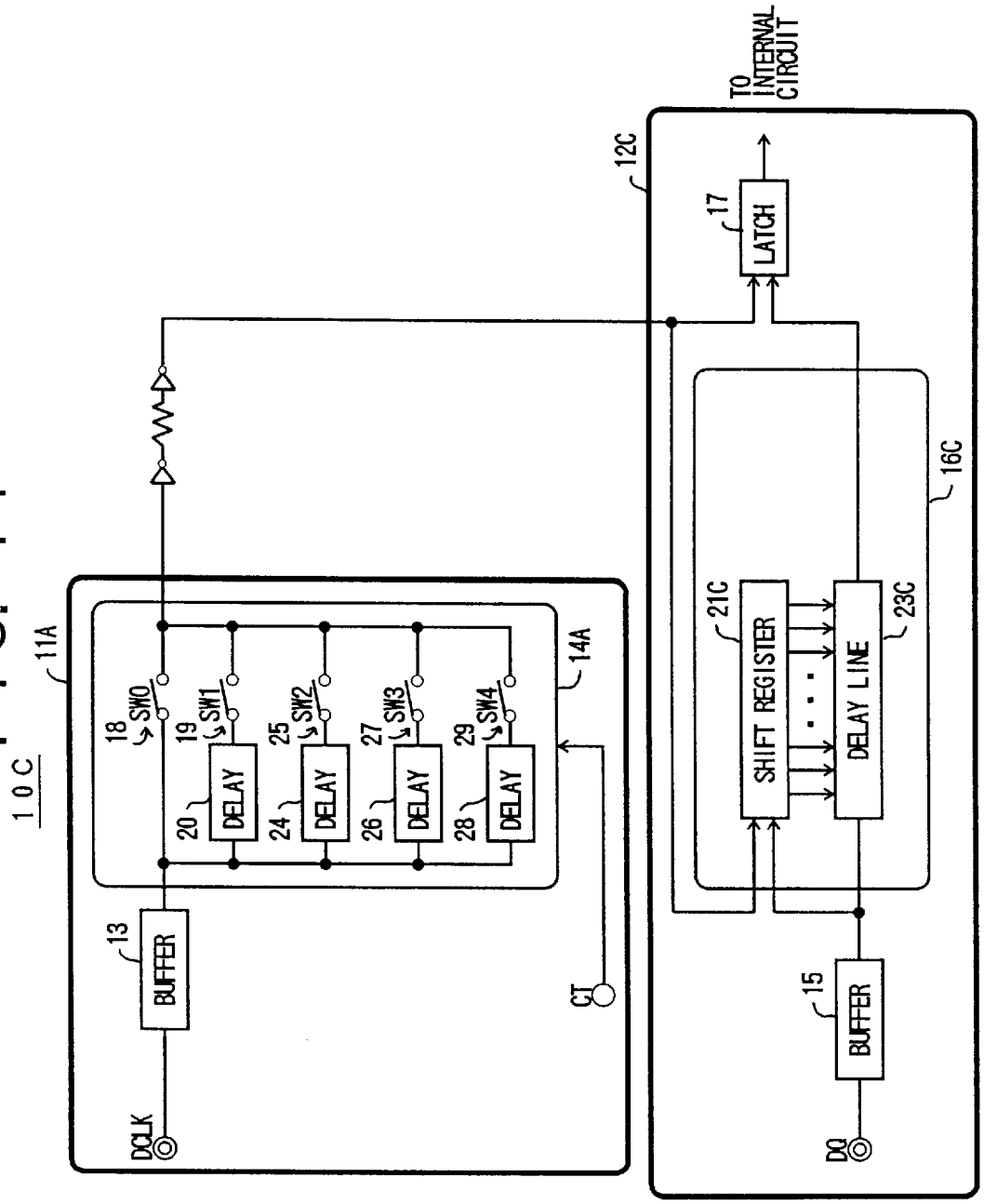
FIG. 11 is a block diagram of a fourth embodiment of a skew reducing circuit according to the present invention.

FIG. 11 is a block diagram of a fourth embodiment of a skew reducing circuit according to the present invention. In FIG. 11, the same elements as those of FIG. 6 are referred to by the same numerals, and a description thereof will be omitted.

A skew reducing circuit 10C of FIG. 11 includes the clock switching unit 11A and a skew reducing unit 12C. The clock switching unit 11A is the same as the clock switching unit 11A of the second embodiment shown in FIG. 6. The skew reducing unit 12C differs from the skew reducing unit 12 of the first and second embodiments only in the phase adjustment unit 16C.

The phase adjustment unit 16C includes a shift register 21C and a delay line 23C. The shift register 21C in the calibration mode compares the clock signal DCLK from the clock switching unit 11A with the data signal DQ from the buffer 15, and determines a delay amount of the delay line 23C. In this embodiment, only one calibration pattern is used. Further, a feedback-loop control is not used for phase adjustment as in the phase adjustment unit 16 of FIG. 6, and only one-time phase comparison is sufficient for deciding the delay amount of the delay line 23C in this embodiment.

Figure 12:
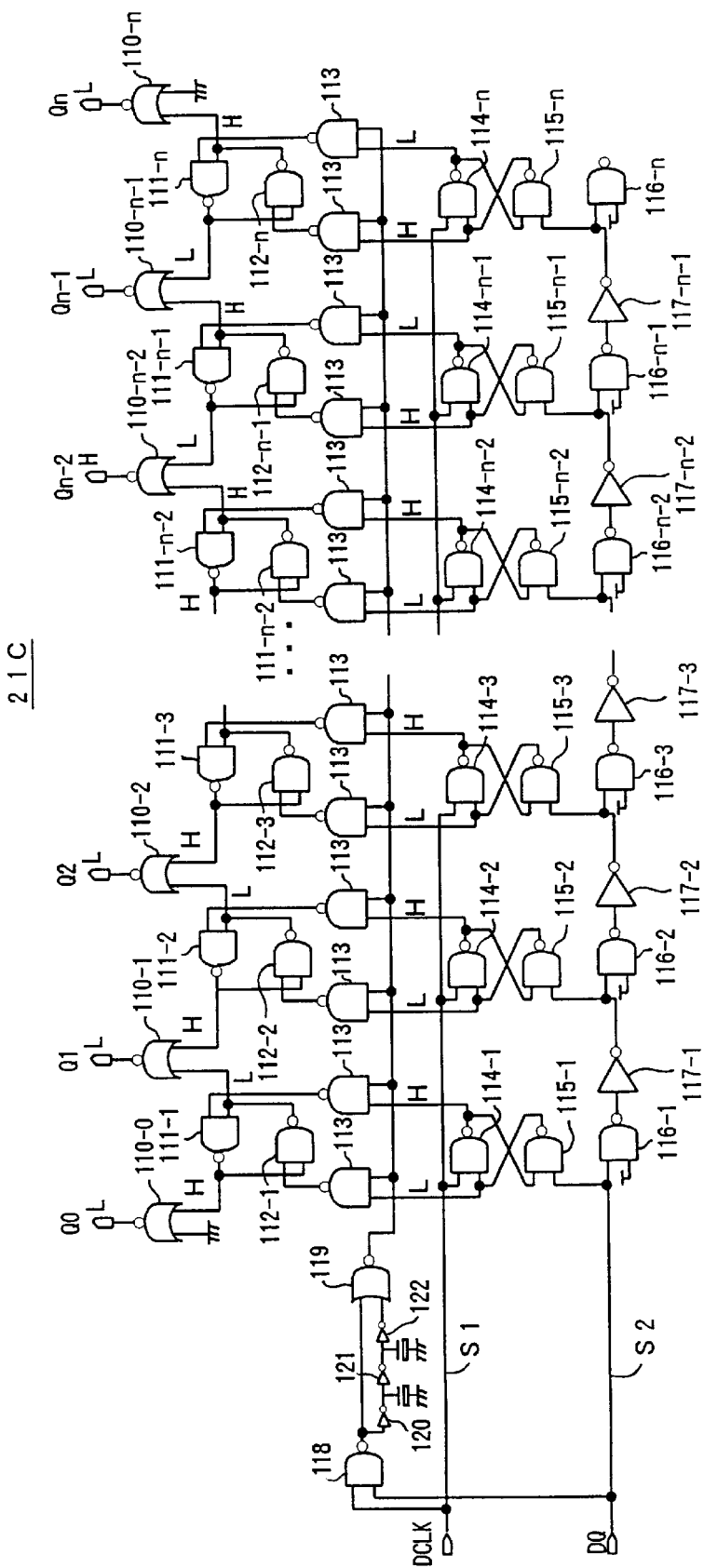
FIG. 12 is a circuit diagram of a shift register of FIG. 11.

FIG. 12 is a circuit diagram of the shift register 21C of FIG. 11.

The shift register 21C of FIG. 12 includes NOR circuits 110-0 through 110-n, NAND circuits 111-1 through 111-n, NAND circuits 112-1 through 112-n, a plurality of NAND circuits 113, NAND circuits 114-1 through 114-n, NAND circuits 115-1 through 115-n, NAND circuits 116-1 through 116-n, inverters 117-1 through 117-n−1, a NAND circuit 118, a NOR circuit 119, and inverters 120 through 122.

The clock signal DCLK propagates via a signal line S1. The data signal DQ propagates via a signal line S2, and is delayed by a delay line comprising the NAND circuits 116-1 through 116-n and the inverters 117-1 through 117-n−1. Since the clock signal DCLK has a phase which is further behind, a latch comprised of the NAND circuits 114-1 and 115-1 latches a rise of a signal level in the data signal DQ, and supplies LOW and HIGH signals to the NAND circuits 113 as shown in FIG. 12. A given pair of the NAND circuits 114-x and 115-x which latches a rise of a signal level in the data signal DQ supplies the same LOW and HIGH signals to the NAND circuits 113.

The data signal DQ propagates on the signal line S2 while experiencing delays by the delay line. Because of this, a given latch comprised of the NAND circuits 114-x and 115-x latches a rise of a signal level in the clock signal DCLK if x is sufficiently large such that a timing difference between the data signal DQ and the clock signal DCLK is smaller than a total delay amount of delay stages arranged before the position x. In an example of FIG. 12, a latch comprised of the NAND circuits 114-n−1 and 115-n−1 and a latch comprised of the NAND circuits 114-n and 115-n latch a rise in the clock signal DCLK, and supplies LOW and HIGH signals to the NAND circuits 113 as shown in FIG. 12.

A circuit made up from the NAND circuit 118, the NOR circuit 119, and the inverters 120 through 122 generates a HIGH pulse when a predetermined time period passes after both the clock signal DCLK and the data signal DQ change to HIGH. This HIGH pulse is supplied to the NAND circuits 113 serving as gates so as to provide the data of the latches comprised of the NAND circuits 114-1 through 114-n and 115-1 through 115-n to latches comprised of the NAND circuits 111-1 through 111-n and 112-1 through 112-n.

As a result, only an output signal Qn-2 of the NOR circuit 110-n−2 is HIGH, while remaining output signals Q0 through Qn-3, Qn-1, and Qn are LOW. Data which is latched by a series of latches comprised of the NAND circuits 114-1 through 114-n and 115-1 through 115-n differs between the left side and the right side of the latch series, and a position of the data change depends on the timing difference between the data signal DQ and the clock signal DCLK. The position of the data change is located further left as this timing difference decreases, and is shifted right as the timing difference increases. Namely, the only one HIGH signal among the output signals Q0 through Qn shifts its position, depending on the timing difference between the data signal DQ and the clock signal DCLK.

These signals Q1 through Qn are supplied to the delay line 23C to adjust the delay amount of the delay line 23C.

Figure 13:
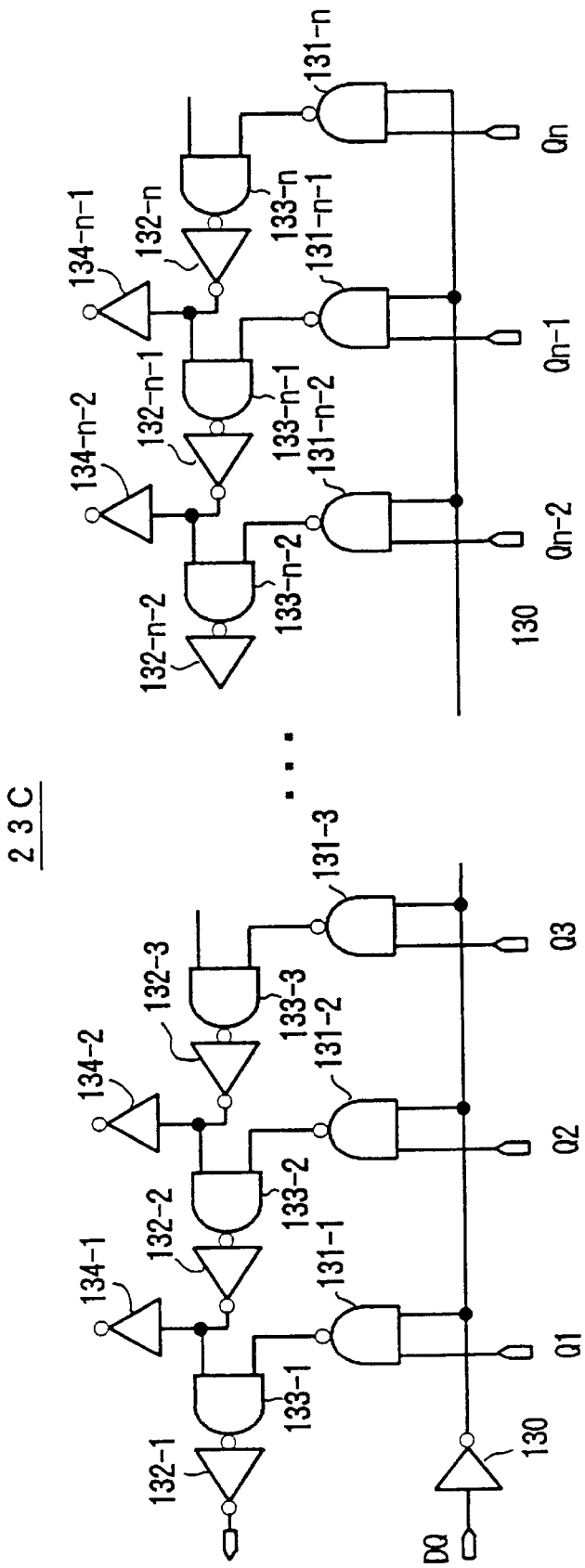
FIG. 13 is a circuit diagram of a delay line.

FIG. 13 is a circuit diagram of the delay line 23C.

The delay line 23C of FIG. 13 includes an inverter 130, NAND circuits 131-1 through 131-n, inverters 132-1 through 132-n, NAND circuits 133-1 through 133-n, and inverters 134-1 through 134-n−1. Elements other than the inverters 134-1 through 134-n−1 are the same elements as those of the delay line 23 shown in FIG. 5, and a description thereof will be omitted.

The delay line 23C of FIG. 13 receives the signal Q1 through Qn, among which only one signal is HIGH, and determines the delay amount of the data signal DQ passing through the delay line 23 based on the position of the HIGH signal. Here, the inverters 134-1 through 134-n−1 are provided as dummy elements to ensure that the delay line 23C of FIG. 13 have the same characteristics as the delay line of the shift register 21C shown in FIG. 12. Because of these dummy elements, the delay line of FIG. 13 can generate a delay time equal to the timing difference between the clock signal DCLK and the data signal DQ when this timing difference is measured by the delay line of FIG. 12.

The shift register 21C and the delay line 23C described above are used in the fourth embodiment so that the shift register 21C detects the timing difference between the clock signal DCLK and the data signal DQ, and the delay line 23C is controlled to have a delay time equal to this timing difference. In this manner, the phase of the data signal DQ can be adjusted such that the data signal DQ after passing through the delay line 23C has a phase aligned to the phase of the clock signal DCLK having no delay.

Figure 14:
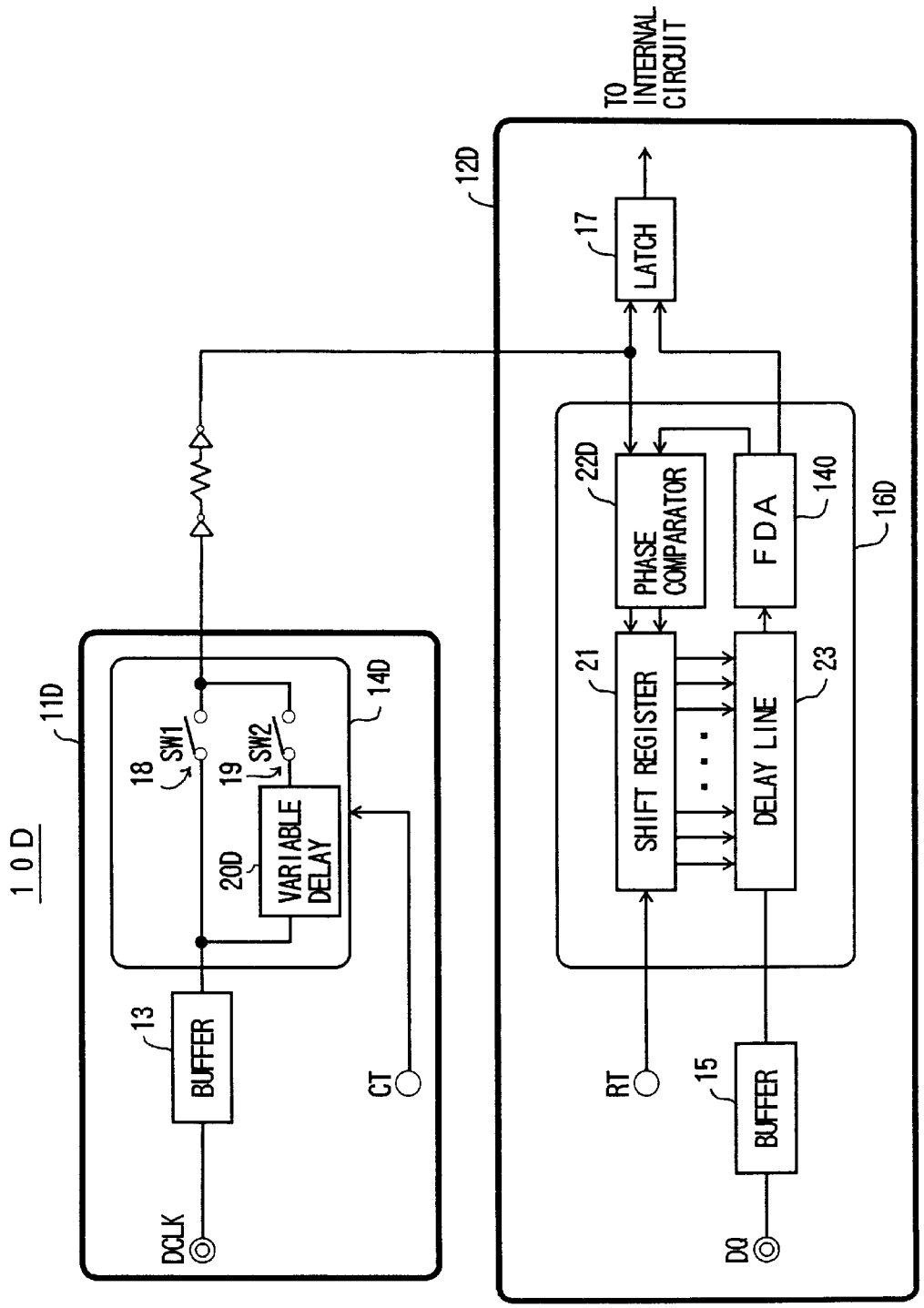
FIG. 14 is a block diagram of a fifth embodiment of a skew reducing circuit according to the present invention.

FIG. 14 is a block diagram of a fifth embodiment of a skew reducing circuit according to the present invention. In FIG. 14, the same elements as those of FIG. 1 are referred to by the same numerals, and a description thereof will be omitted.

A skew reducing circuit 10D of FIG. 14 includes a clock switching unit 11D and a skew reducing unit 12D.

The clock switching unit 11D includes the buffer 13 and a delay switching unit 14D. The delay switching unit 14D includes the switches 18 and 19 and a variable-delay unit 20D. In the calibration mode used for skew reduction, the clock signal DCLK input to the buffer 13 for data-signal synchronization is supplied to the skew reducing unit 12D via the switch 18. In the normal operation mode, the clock signal DCLK input to the buffer 13 is delayed by the variable-delay unit 20D by a variable delay amount, and, then, is supplied to the skew reducing unit 12D via the switch 19. Switching of operations between the calibration mode and the normal operation mode, as well as setting of a delay amount to the variable-delay unit 20D in the normal operation mode, are performed by a control signal CT.

Functions of the variable-delay unit 20D are the same as those of the delay units 20, 24, 26, and 28 of the second embodiment shown in FIG. 6, i.e., to select an appropriate setup time according to various conditions such as the frequency of the clock signal DCLK.

The skew reducing unit 12D includes the buffer 15, a phase adjustment unit 16D, and the latch 17. The phase adjustment unit 16D includes the shift register 21, a phase comparator 22D, the delay line 23, and a FDA unit 140. The fifth embodiment of FIG. 14 uses the FDA unit 140 which is a fine delay adjustor capable of controlling a delay time at a finer precision than the delay line 23.

Accuracy of the skew reducing circuits of previous embodiments is limited by a minimum pitch of a delay time, which is provided by one stage of the delay line and is typically about 200 ps. As operation frequencies of devices are increased, higher accuracy is required. A delay time thus needs to be controlled at higher accuracy by using elements having different delay times. In the fifth embodiment, the FDA unit 140 is used for providing adjustment by a 100-ps pitch.

Figure 15:
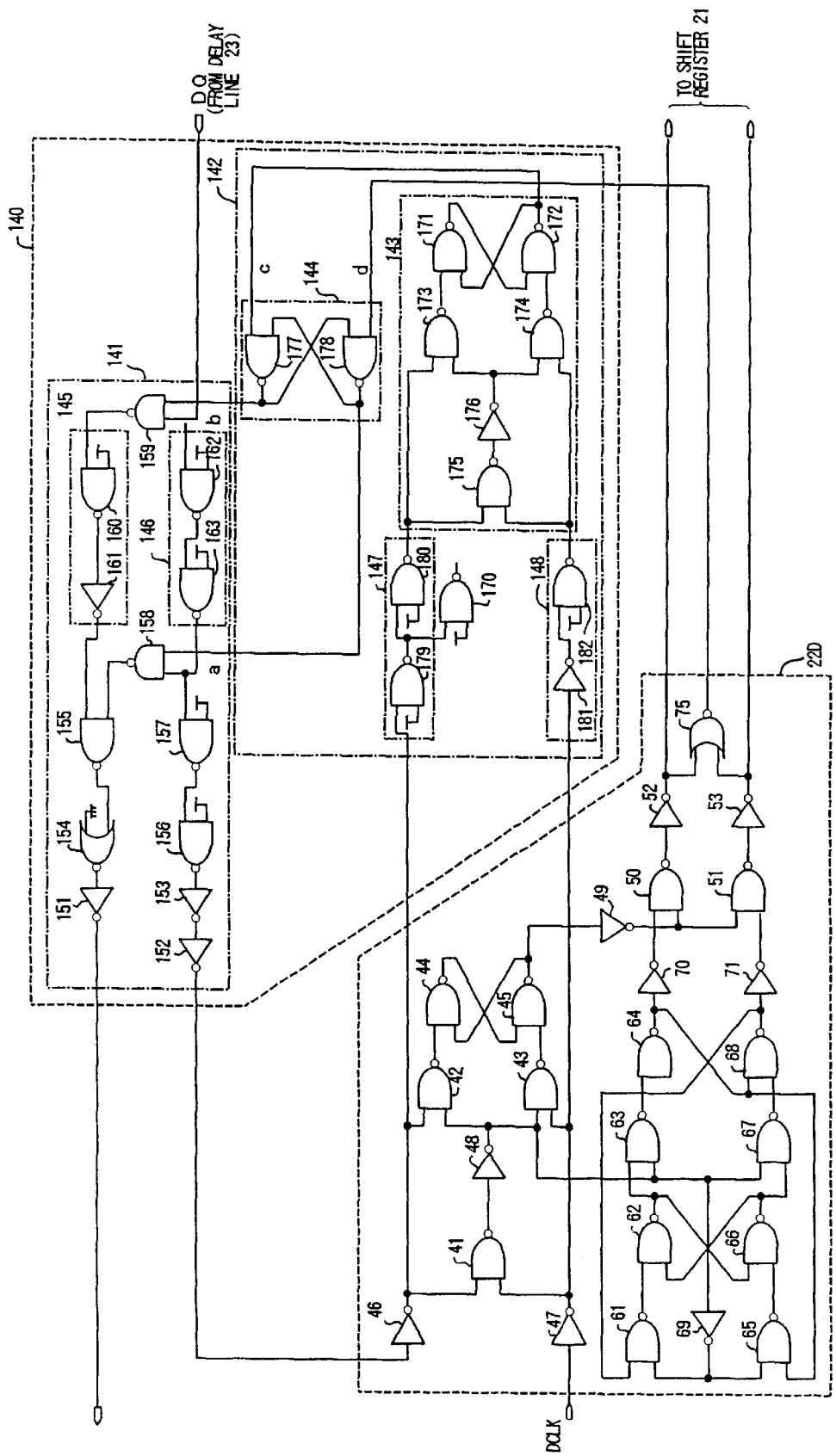
FIG. 15 is a circuit diagram of a FDA unit and a phase comparator of FIG. 14.

FIG. 15 is a circuit diagram of the FDA unit 140 and the phase comparator 22D of FIG. 14. The phase comparator 22D of FIG. 15 is the same as the phase comparator 22 of FIG. 4, except for an additional NOR circuit 75 provided at the output of the phase comparator 22, and a description thereof will be omitted.

The FDA unit 140 includes a fine delay line 141 and a fine phase comparator 142.

The fine delay line 141 includes delay elements 145 and 146, inverters 151 through 153, a NOR circuit 154, and NAND circuits 155 through 159. The delay element 145 includes a NAND circuit 160 and an inverter 161, and the delay element 146 includes NAND circuits 162 and 163. Signals a and b are provided from the fine phase comparator 142. One of the signals a and b is HIGH, and the other is LOW. Depending on which one of the signals a and b is HIGH, the data signal DQ passes through either the delay element 145 or the delay element 146. Selection of the paths achieves a delay adjustment by a pitch of 100 ps.

The fine phase comparator 142 includes a NAND circuit 170, a phase comparator 143, a latch 144, and delay elements 147 and 148. The phase comparator 143 includes NAND circuits 171 through 175 and an inverter 176. The latch 144 includes NAND circuits 177 and 178. The delay element 147 includes NAND circuits 179 and 180, and the delay element 148 includes an inverter 181 and a NAND circuit 182.

The delay element 147 which is comprised of the same elements and has the same delay time as the delay element 146 is provided on the path of the data signal DQ. Also, the delay element 148 which is comprised of the same elements and has the same delay time as the delay element 145 is provided on the path of the clock signal DCLK. Outputs of these delay elements 147 and 148 are compared in terms of phase by the phase comparator 143, and a result of the phase comparison is supplied as a signal c to the latch 144. The latch 144 is reset by a signal d when the phase comparator 22D outputs a HIGH pulse in order to control the delay line 23 via the shift register 21.

The latch 144 supplies the signals a and b to the fine delay line 141, where one of the signals a and b is HIGH while the other is LOW as previously described, thereby achieving a fine delay adjustment by a pitch of 100 ps.

In this manner, a delay adjustment finer than the accuracy of the delay line 23 can be achieved. In this embodiment, the fine delay adjustor is comprised of two stages. However, the same principle can apply in the case of a larger number of stages in which a delay difference between the delay elements 145 and 146 is made smaller, thereby achieving higher accuracy than the above example.

Figure 16:
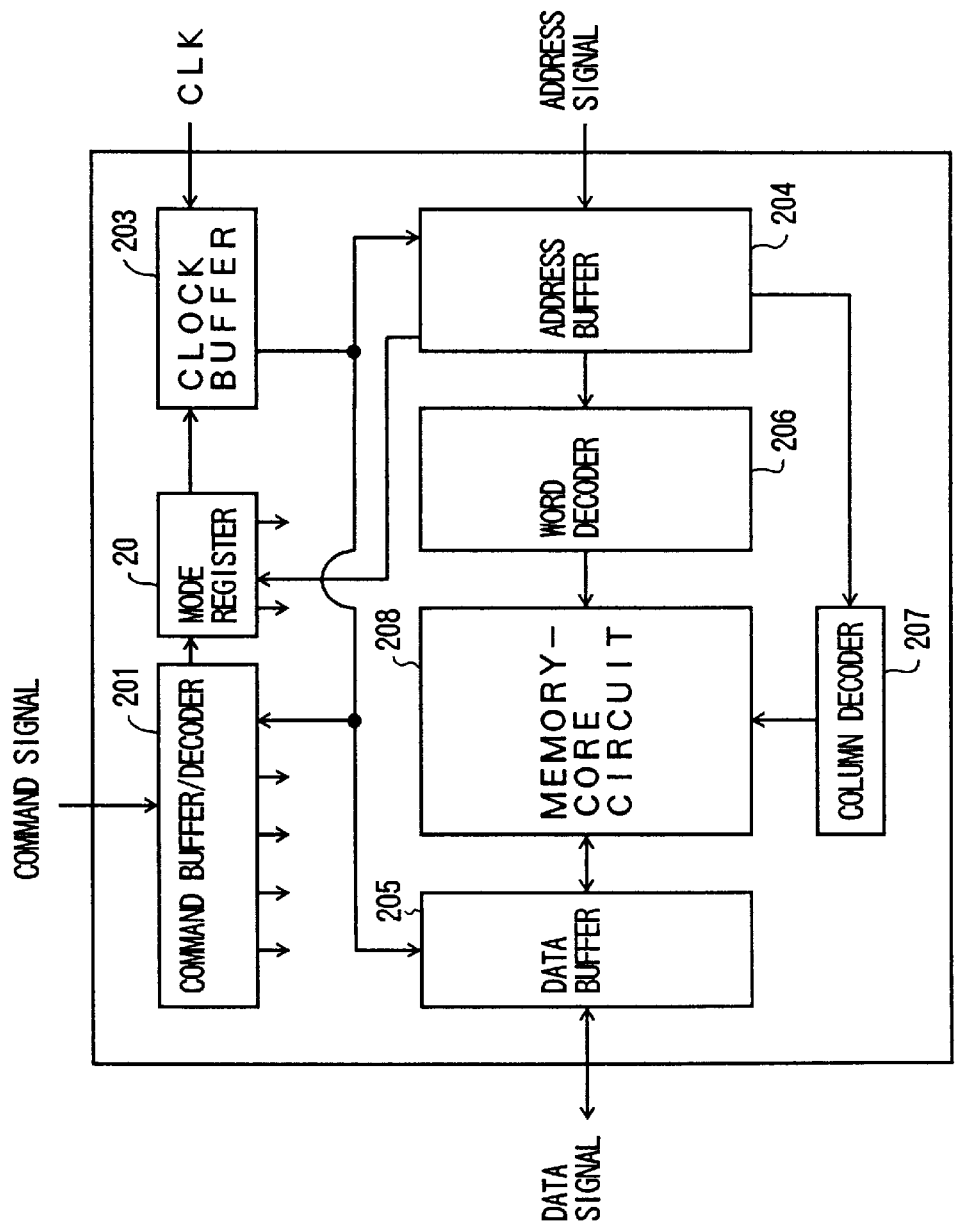
FIG. 16 is a block diagram of a semiconductor memory device to which the skew reducing circuit of the present invention is applied.

FIG. 16 is a block diagram of a semiconductor memory device to which the skew reducing circuit of the present invention is applied.

A semiconductor memory device 200 of FIG. 16 includes a command buffer/decoder 201, a mode register 202, a clock buffer 203, an address buffer 204, a data buffer 205, a word decoder 206, a column decoder 207, and a memory-core circuit 208.

The command buffer/decoder 201 receives command signals, and decodes commands to control each element of the semiconductor memory device 200 based on the decoded commands. Addresses input to the address buffer 204 are decoded by the word decoder 206 and the column decoder 207, and access is made to an indicated address of the memory-core circuit 208. Data reading/writing is carried out via the data buffer 205 with respect to the accessed address.

The mode register 202 stores signals from the address buffer 204 as mode-selection data in response to a mode setting command. Depending on the data stored in the mode register 202, an operation mode is selected, including a self-refresh mode for performing self-refresh operations of the memory-core circuit 208, a power-down mode for putting each element into a power-down condition, etc.

The clock buffer 203 includes the clock switching unit 11 of the skew reducing circuit 10 according to the present invention. When the mode register 202 indicates the calibration operation, the clock buffer 203 supplies a clock signal CLK to the command buffer/decoder 201, the address buffer 204, and the data buffer 205. When the mode register 202 indicates the normal operation mode, the clock buffer 203 supplies a clock signal CLK with a delay corresponding to a setup time to the command buffer/decoder 201, the address buffer 204, and the data buffer 205. The delay commensurate with the setup time may be determined based on information on an operation frequency stored in the mode register 202.

The command buffer/decoder 201, the address buffer 204, and the data buffer 205 includes the skew reducing unit 12 of the skew reducing circuit 10 according to the present invention. In calibration operations, the skew reducing unit 12 adjusts phases of input signals such that the phases of the input signals are aligned to the phase of the clock signal CLK. In the normal operation mode, the skew reducing unit 12 reads the phase-adjusted input signals by using the clock signal CLK with the setup-time delay as a synchronization signal.

The calibration operations may be performed by selecting a calibration mode. The calibration mode may be periodically selected at predetermined intervals.

Alternately, the calibration operations may be conducted immediately after the power-on of the device, or may be performed during the self-refresh mode. Alternately, the calibration operations may be carried out immediately after the device recovers from the power-down mode. Timings of the calibration operations are a matter of design choice or a matter which is decided by users at the time of device use, and can be determined by taking into consideration relations with other operations of the semiconductor memory device.

Further, the present invention is not limited to these embodiments, but various variations and modifications may be made without departing from the scope of the present invention.

What is claimed is:

1. A circuit operating either in a first operation mode or in a second operation mode, said circuit comprising:

a clock switching unit, receiving a clock signal, outputting said clock signal in the first operation mode, and outputting a delayed clock signal obtained by delaying said clock signal in the second operation mode; and a skew reducing unit, receiving an input signal, adjusting a phase of said input signal based on said clock signal from said clock switching unit in said first operation mode, and latching said input signal having the adjusted phase by using said delayed clock signal from said clock switching unit in said second operation mode.

2. The circuit as claimed in claim 1, further comprising a register for storing information about a frequency of said clock signal, wherein said clock switching unit determines an amount of delay based on said information, said amount of delay being used for delaying said clock signal to obtain said delayed clock signal.

3. The circuit as claimed in claim 1, wherein said skew reducing unit further comprises a frequency divider for dividing a frequency of said clock signal, and adjusts said phase of said input signal based on said clock signal having a divided frequency.

4. The circuit as claimed in claim 1, wherein said skew reducing unit comprises:

a phase adjustment unit adjusting said phase of said input signal based on said clock signal in said first mode; and a latch for latching said input signal having said adjusted phase by using said delayed clock signal as a synchronization signal in said second mode.

5. The circuit as claimed in claim 4, wherein said clock switching unit outputs said delayed clock signal by delaying said clock signal by a setup time of said latch.

6. The circuit as claimed in claim 4, wherein said phase adjustment unit comprises:

a delay line delaying said input signal through a series of delay elements; and a control circuit for measuring a phase difference between said clock signal and said input signal and for setting a delay amount corresponding to said phase difference to said delay line.

7. The circuit as claimed in claim 4, wherein said phase adjustment unit includes a delay line delaying said input signal for adjusting said phase of said input signal based on said clock signal, said delay line including delay elements comprised of logic elements.

8. The circuit as claimed in claim 4, wherein said phase adjustment unit includes a delay line delaying said input signal for adjusting said phase of said input signal based on said clock signal, said delay line having a hierarchical structure.

9. The circuit as claimed in claim 4, wherein said phase adjustment unit includes a delay line delaying said input signal for adjusting said phase of said input signal based on said clock signal, said delay line including delay elements comprised of capacitors and resistors.

10. The circuit as claimed in claim 9, wherein said delay line adjusts a delay thereof by changing resistances of said resistors.

11. The circuit as claimed in claim 9, wherein said delay line adjusts a delay thereof by changing capacitances of said capacitors.

12. The circuit as claimed in claim 9, wherein said delay line adjusts a delay thereof by changing capacitances of said capacitors and resistances of said resistors.

13. The circuit as claimed in claim 4, wherein said phase adjustment unit comprises:

a delay line generating a delayed input signal by delaying said input signal through a series of delay elements;

a phase comparator making a phase comparison between said delayed input signal and said clock signal; and a control circuit for adjusting an amount of delay of said delay line based on results of said phase comparison.

14. The circuit as claimed in claim 13, wherein said phase adjustment unit receives a plurality of calibration patterns as said input signal, and adjusts said phase of said input signal such that phases are matched between said clock signal and an average pattern of said plurality of calibration patterns.

15. The circuit as claimed in claim 14, wherein a number of said plurality of calibration patterns is at least the same as a number of stages of said series of delay elements.

16. The circuit as claimed in claim 14, wherein said clock switching circuit outputs said delayed clock signal by delaying said clock signal substantially by a ¼ cycle.

17. The circuit as claimed in claim 13, wherein said control circuit is capable of adjusting said amount of delay only by decreasing said amount of delay, and decreases said amount of delay from a maximum amount initially set to said delay line when said phase comparator detects that a phase of said delayed input signal is behind a phase of said clock signal.

18. The circuit as claimed in claim 17, wherein said phase adjustment unit receives a plurality of calibration patterns as said input signal, and adjusts said phase of said input signal such that phases are matched between said clock signal and the most delayed pattern of said plurality of calibration patterns.

19. The circuit as claimed in claim 18, wherein a number of said plurality of calibration patterns is at least the same as a number of stages of said series of delay elements.

20. A semiconductor device operating either in a first operation mode or in a second operation mode, comprising:

a clock switching unit, receiving a clock signal, outputting said clock signal in the first operation mode, and outputting a delayed clock signal obtained by delaying said clock signal in the second operation mode;

a skew reducing unit, receiving an input signal, adjusting a phase of said input signal based on said clock signal from said clock switching unit in said first operation mode, and latching said input signal having the adjusted phase by using said delayed clock signal from said clock switching unit in said second operation mode; and an internal circuit receiving said input signal latched by said skew reducing unit in said second operation mode.

21. The semiconductor memory device as claimed in claim 20, wherein said first operation mode is selected immediately after a power-on of said semiconductor memory device.

22. The semiconductor memory device as claimed in claim 20, wherein said first operation mode is periodically selected at predetermined intervals.

23. The semiconductor memory device as claimed in claim 20, wherein said first operation mode is selected at a time of a self-refresh operation.

24. The semiconductor memory device as claimed in claim 20, wherein said first operation mode is selected immediately after said semiconductor memory device recovers from a power-down mode thereof.

* * * * *